(12) United States Patent
Shi

(10) Patent No.: US 10,367,066 B2
(45) Date of Patent: Jul. 30, 2019

(54) THIN FILM TRANSISTOR AND METHOD FOR MANUFACTURING THE SAME

(71) Applicant: Shenzhen China Star Optoelectronics Technology Co., Ltd., Shenzhen, Guangdong (CN)

(72) Inventor: Longqiang Shi, Guangdong (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 316 days.

(21) Appl. No.: 15/328,945

(22) PCT Filed: Jan. 11, 2017

(86) PCT No.: PCT/CN2017/070829
§ 371 (c)(1),
(2) Date: Apr. 27, 2017

(87) PCT Pub. No.: WO2018/040475
PCT Pub. Date: Mar. 8, 2018

(65) Prior Publication Data
US 2018/0337237 A1   Nov. 22, 2018

(30) Foreign Application Priority Data

Aug. 31, 2016 (CN) .......................... 2016 1 0793911

(51) Int. Cl.
*H01L 29/24* (2006.01)
*H01L 21/322* (2006.01)
(Continued)

(52) U.S. Cl.
CPC ............ *H01L 29/24* (2013.01); *H01L 21/322* (2013.01); *H01L 21/443* (2013.01); *H01L 29/45* (2013.01);
(Continued)

(58) Field of Classification Search
CPC ....... H01L 21/28; H01L 29/786; H01L 29/24; H01L 21/322
See application file for complete search history.

(56) References Cited

U.S. PATENT DOCUMENTS

2002/0109797 A1    8/2002 Chung et al.
2015/0179442 A1*   6/2015 Lee .................. H01L 29/66742
                                                  438/104
(Continued)

FOREIGN PATENT DOCUMENTS

CN        1534742       10/2004
CN      101013670        8/2007
(Continued)

OTHER PUBLICATIONS

International Search Report and Written Opinion for International Application No. PCT/CN2017/070829, dated May 26, 2017.
(Continued)

*Primary Examiner* — Dung A. Le

(57) ABSTRACT

Disclosed are a thin film transistor and a method for manufacturing the same, which relates to the technical field of display. Each of a source and a drain of the thin film transistor includes a first metal layer, a second metal layer, and a third metal layer. The first metal layer is in contact with an IGZO (indium gallium zinc oxide) layer, and a metal diffusion layer is provided at a contact face. Meanwhile, disclosed is a method for manufacturing the thin film transistor: sequentially obtaining the first metal layer, the second metal layer, and the third metal layer through deposition; then obtaining PV layers; and then performing high temperature annealing treatment on the PV layers to diffuse a metal within the first metal layer into the IGZO layer, thereby forming a metal diffusion layer. The metal diffusion layer forms Ohmic contact between the first metal layer and
(Continued)

the IGZO layer, thus reducing contact resistance both between the source and the IGZO layer and between the drain and the IGZO layer.

5 Claims, 3 Drawing Sheets

(51) Int. Cl.
    *H01L 21/443* (2006.01)
    *H01L 29/45* (2006.01)
    *H01L 29/66* (2006.01)
    *H01L 29/786* (2006.01)

(52) U.S. Cl.
    CPC .... *H01L 29/66969* (2013.01); *H01L 29/7869* (2013.01)

(56) References Cited

U.S. PATENT DOCUMENTS

| | | | | |
|---|---|---|---|---|
| 2015/0311345 | A1* | 10/2015 | Zhao | H01L 29/7869 257/43 |
| 2017/0352689 | A1* | 12/2017 | Chung | H01L 27/1225 |

FOREIGN PATENT DOCUMENTS

| | | |
|---|---|---|
| CN | 101645418 | 2/2010 |
| CN | 102598284 | 7/2012 |
| CN | 106229260 | 12/2016 |
| JP | 2002026335 | 1/2002 |

OTHER PUBLICATIONS

Chinese Office Action and Search Report for Chinese Patent Application No. 201610793911.3, dated Jun. 22, 2017.

* cited by examiner

THIN FILM TRANSISTOR AND METHOD FOR MANUFACTURING THE SAME

CROSS-REFERENCE TO RELATED APPLICATIONS

The present application claims the priority of Chinese patent application CN 201610793911.3, entitled "Thin film transistor and method for manufacturing the same" and filed on Aug. 31, 2016, the entirety of which is incorporated herein by reference.

FIELD OF THE INVENTION

The present disclosure relates to the technical field of display, and in particular, to a thin film transistor and a method for manufacturing the same.

BACKGROUND OF THE INVENTION

IGZO is the abbreviation of indium gallium zinc oxide, and amorphous IGZO is a channel layer material used in the new-generation thin film transistor technology, which is a thin film transistor (TFT) technique and refers to applying a layer of metal oxides on a TFT-LCD active layer. In short, IGZO is just a channel layer material, but not a novel panel technique, and does not belong to the same level with IPS, SVA or OLED. In general, IGZO is still within the scope of TFT-LCD. IGZO material is first proposed and used in the TFT industry by Hideo Hosono, from Tokyo Institute of Technology. IGZO-TFT technology first achieves mass production in Japan Sharp Corporation.

TFT (Thin Film Transistor), which is positioned in pixel driving modules within a lower glass substrate of a liquid crystal panel, is in a form of a thin film, and is embedded in the driving modules together with pixel elements. A TFT liquid crystal screen means each liquid crystal pixel site on the liquid crystal display panel is driven by a thin film transistor integrated thereafter. In general, the features of TFT are essentially the same as those of a semiconductor transistor. A drive current of TFT charges a pixel capacitor, and turns on an electrical converting apparatus of the pixel, while IGZO is used on TFT.

As shown in FIG. 2, when metal is in contact with IGZO, a semiconductor band bends at an interface to form a barrier. The presence of the barrier will lead to a large interface resistance, such that a Schottky diode contact is formed between a source 3 and an IGZO layer 4 and between a drain 4 and the IGZO layer 4. Schottky resistance will cause an on-state current of a TFT element to be in an undercurrent condition, a sub-threshold swing (SS) to be too large, and the stability of the element to be decrease, which will affect the image display quality.

Therefore, an important factor for determining the performance of the semiconductor element is to reduce the contact resistance between metal and IGZO to form Ohmic contact. One of the methods of forming good Ohmic contact is to perform N-type doping (n+IGZO) on a semiconductor region in contact with the metal, such that a depletion region of the interface gets narrowed and electrons have more chances to conduct direct tunneling (Tunneling Effect).

Existing methods of N+IGZO (i.e. N-type doping) utilize doping, namely injecting heavy metals, H+ or others into the IGZO after the completion of IGZO, which is a complex and time-consuming process, and substantially increases manufacturing costs.

SUMMARY OF THE INVENTION

The technical problem to be solved by the present disclosure is how to reduce contact resistance between a metal and an IGZO, and to form Ohmic contact. In order to resolve this technical problem, the present application proposes a thin film transistor and a method for manufacturing the same.

The thin film transistor proposed in the present disclosure is provided with a gate layer, a gate insulation layer, an IGZO (indium gallium zinc oxide) layer, a source, and a drain in sequence from inside to outside, wherein, each of the source and the drain is provided with a first metal layer, a second metal layer, and a third metal layer in sequence from inside to outside, wherein, the first metal layer is in contact with the IGZO layer.

Each of the source and the drain uses three metal layers, wherein the first metal layer will be diffused into the IGZO layer at an interface between the first metal layer and the IGZO layer, thereby reducing the contact resistance both between the source and the IGZO and between the drain and the IGZO.

Further, the first metal layer is indium (In); the second metal layer is molybdenum (Mo) or titanium (Ti); and the third metal layer is copper or aluminum.

Since the first metal layers are indium, and indium is a silver gray and very soft fusible metal having a melting point of 156.61° C. and high conductivity, indium is easier to be diffused into the IGZO layer, to reduce the contact resistance between the first metal layer and the IGZO layer during manufacture.

Further, passivation layers are provided on the source, the drain, and the IGZO layer.

Further, the passivation layers are silicon oxide thin film.

Further, a metal diffusion layer is disposed at a contact part between the IGZO layer and the first metal layer. The metal diffusion layer can reduce the contact resistance both between the source and the IGZO layer and between the drain and the IGZO layer, so as to achieve Ohmic contact.

The method for manufacturing a thin film transistor proposed in the present disclosure comprises the following steps:

Step I. sequentially preparing a gate layer, a gate insulation layer, and an IGZO layer;

Step II. preparing a source and a drain based on the above step, and sequentially preparing a first metal layer, a second metal layer, and a third metal layer on each of the gate insulation layer and the IGZO layer;

Step III. preparing passivation (PV) layers based on the above step; and

Step IV. performing high temperature annealing treatment on the passivation layers based on the above step, and indium within the first metal layer diffusing into the IGZO layer to form a metal diffusion layer, such that Ohmic contact is formed at interfaces both between the IGZO layer and the source and between the IGZO layer and the drain.

High temperature annealing in Step IV not only eliminates internal stress produced during manufacture, but more importantly, indium within the first metal layer in contact with the IGZO layer is diffused into the IGZO layer at the high temperature, such that Ohmic contact is formed between the first metal layer and the IGZO layer.

Further, each of the source and the drain is provided with a first metal layer, a second metal layer, and a third metal layer. The first metal layer is indium; the second metal layer is molybdenum or titanium; and the third metal layer is copper or aluminum.

Further, the first metal layer, the second metal layer, and the third metal layer are obtained sequentially by physical vapor deposition.

Further, after the first metal layer, the second metal layer, and the third metal layer are deposited, photolithographic and etching procedures are performed to obtain a thin film transistor structure.

Further, the passivation layers are obtained by depositing silicon oxide thin film through chemical vapor deposition.

Compared with the prior art, the present disclosure has the following advantages.

In the present disclosure, each of the source and the drain uses the structure of the first metal layer, the second metal layer, and the third metal layer. The first metal layer is In layer; the second metal layer is Mo or Ti layer; and the third layer is Cu or Al layer, wherein, the first metal layer is a bottom layer, namely, a layer contacting with the IGZO layer. Element In plays a conductive role in the IGZO, and increase in content of In will result in the change of the IGZO into an N+IGZO region. Part of In in the source and the drain, in the present disclosure, in subsequent heating procedures, will be diffused into the IGZO to form the N+IGZO region, thereby forming Ohmic contact.

BRIEF DESCRIPTION OF THE DRAWINGS

The present disclosure will be described in a more detailed way below based on embodiments and with reference to the accompanying drawings, in which.

DETAILED DESCRIPTION OF THE EMBODIMENTS

The present disclosure will be further explained in connection with the accompanying drawings.

Embodiment 1

Figure 1:
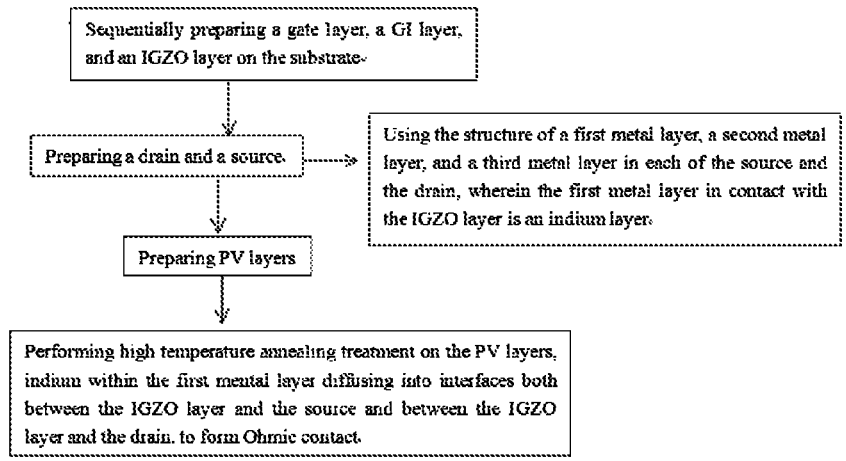
FIG. 1 shows a flow chart of a method for manufacturing a thin film transistor of the present disclosure.
Figure 2:
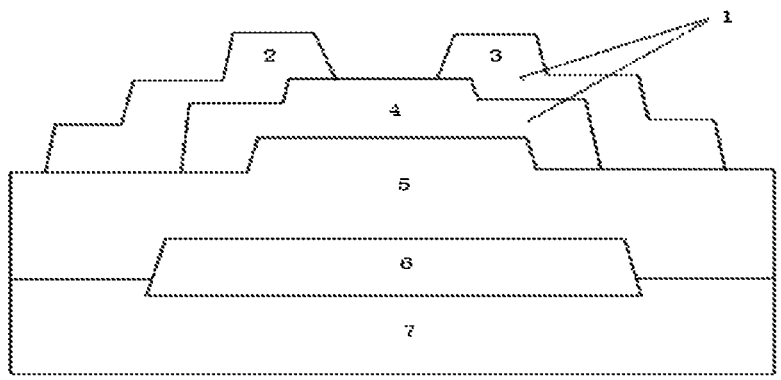
FIG. 2 schematically shows formation of Schottky diode contact between a mental layer and an IGZO (indium gallium zinc oxide) layer, wherein, reference number 1 represents Schottky diode contact formed between the source or the drain and the IGZO; 2 represents an S (source); 3 represents a D (drain); 4 represents an IGZO layer; 5 represents a gate insulation layer; 6 represents a source layer; and 7 represents a substrate.
Figure 3:
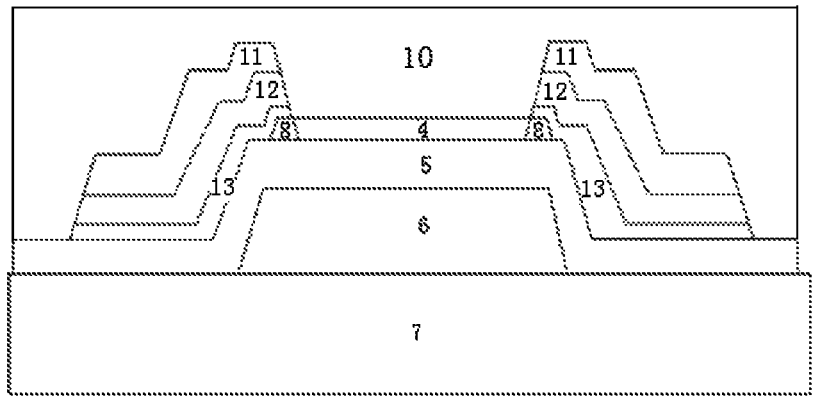
FIG. 3 shows a diagram of the structure of a thin film transistor of the present disclosure, wherein, reference number 10 represents a PV layer; 11 represents a third metal layer; 12 represents a second metal layer; 13 represents a first metal layer; 14 represents an IGZO layer; 8 represents a metal diffusion layer; 5 represents a gate insulation layer; 6 represents a gate layer; and 7 represents a substrate.

In order to resolve the problem that when a metal is in contact with an IGZO, as shown in FIG. 2, a semiconductor band bends to form a barrier and cause a large interface resistance, namely, the problem about Schottky diode contact, the present embodiment provides a way of forming Ohmic contact, as shown in FIG. 3.

As shown in FIG. 3, in the present embodiment, each of a source and a drain uses the structure of a first metal layer 13, a second metal layer 12, and a third metal layer 11. The first metal layer 13 is an indium layer; the second metal layer 12 is a molybdenum or titanium layer; and the third metal layer 11 is a copper or aluminum layer, wherein, the first metal layer 13 is a bottom layer, namely, a layer contacting with an IGZO layer. Through above changes, part of In in the source and the drain, in subsequent heating procedures, will be diffused into an IGZO layer 4, to form a metal diffusion layer N+IGZO region 8, thereby forming Ohmic contact.

Figure 4:
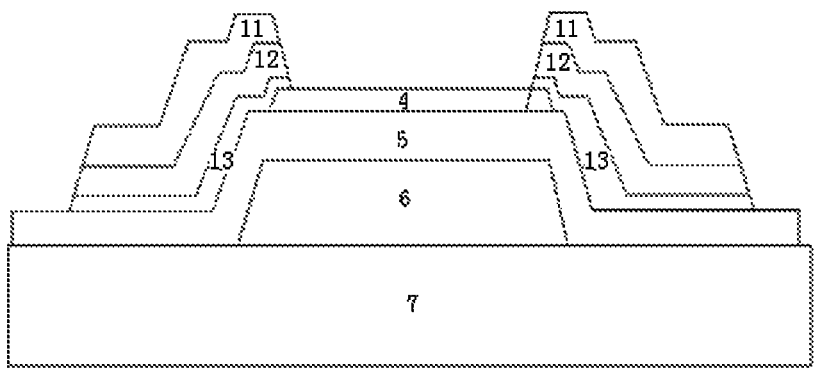
FIG. 4 shows a diagram of the structure obtained by Step II in Embodiment 1, wherein, reference number 11 represents a third metal layer; 12 represents a second metal layer; 13 represents a first metal layer; 4 represents an IGZO layer; 5 represents a gate insulation layer; 6 represents a gate layer; and 7 represents a substrate.
Figure 5:
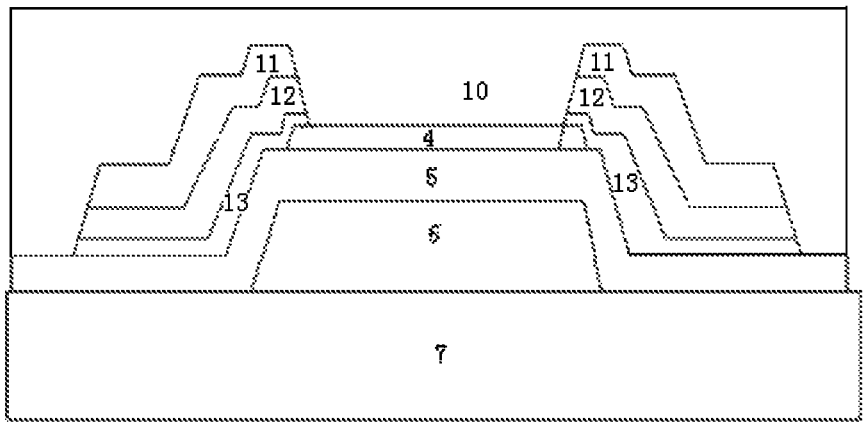
FIG. 5 shows a diagram of the structure obtained by Step II in Embodiment 1, wherein, reference number 10 represents a passivation layer; 11 represents a third metal layer; 12 represents a second metal layer; 13 represents a first metal layer; 4 represents an IGZO layer; 5 represents a gate insulation layer; 6 represents a gate layer; and 7 represents a substrate.
Figure 6:
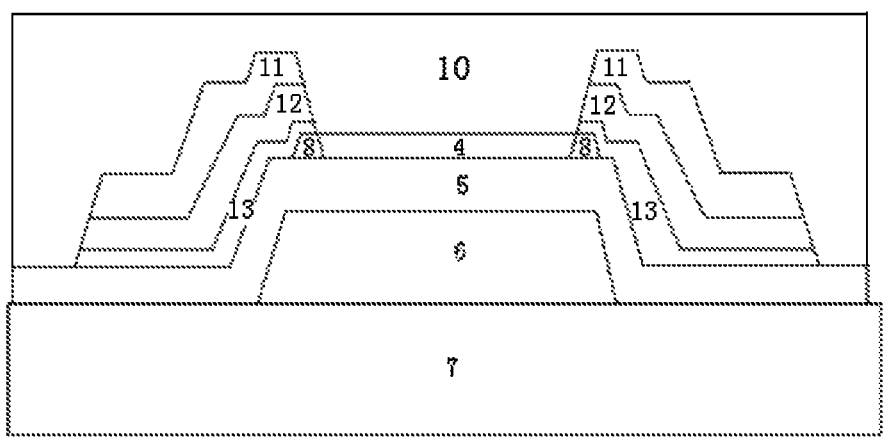
FIG. 6 shows a diagram of the structure obtained by Step IV in Embodiment 1, wherein, reference number 10 represents a PV layer, 11 represents a third metal layer; 12 represents a second metal layer; 13 represents a first metal layer; 4 represents an IGZO layer; 8 represents a metal diffusion layer; 5 represents a gate insulation layer; 6 represents a gate layer; and 7 represents a substrate.

It should be noted that in the present disclosure, as shown in FIG. 3, the first metal layer 13, the second metal layer 12, and the third metal layer 11 on a left side compose the drain, and the first metal layer 13, the second metal layer 12, and the third metal layer 11 on a right side compose the source, which is also the case in FIGS. 4-6.

The details are provided as follows:

I. A gate layer, a gate insulation layer, and an IGZO layer are first prepared.

The gate layer 6, the gate insulation layer 5, and the IGZO layer 4 are sequentially deposited on substrate 7, wherein, a selected substrate is a glass substrate, but not limited to glass substrate.

Firstly, the gate layer (Gate) 6 is deposited through plasma chemical vapor deposition on the glass substrate (i.e. substrate 7 shown in FIG. 4). Then the gate insulation layer (GI) 5 is deposited through PECVD. Then, the IGZO layer 4 is deposited using chemical vapor deposition. And then after reactive ionic etching, a structure of Gate, GI, and IGZO is obtained.

Plasma Enhanced Chemical Vapor Deposition (PECVD) as employed for film formation will not damage an IGZO channel, and will help to improve the Ohmic contact and enhance the performance of an element.

II. The drain and the source are prepared.

As shown in FIG. 4, in this step, a diffusion layer is added to the source and the drain, namely, the first metal layer 13 (i.e. In layer), the second metal layer 12 (i.e. molybdenum or titanium layer), and the third metal layer 11 (i.e. copper or aluminum layer) are sequentially deposited by PVD suppter film formation. Then, photolithographic and etching procedures are performed to obtain a designed pattern. During addition of the diffusion layer, it should be ensured that the indium layer is the bottom layer in contact with the IGZO layer 4. The indium element within the IGZO layer 4 plays a conductive role, and the increase in the content of indium will cause the formation of IGZO into [[an]] the N+IGZO region 8. In the present disclosure, part of indium in the source and the drain, in the subsequent heating procedures, will be diffused into the IGZO, to form the N+IGZO region 8. Finally, Ohmic contact is formed. Compared with a conventional way of injecting heavy metals, H+, or others into the IGZO (namely obtaining N+IGZO through N doping), in the present embodiment, indium is added into the source and the drain to enable the indium, in subsequent heating, to be diffused into the IGZO, which simplifies the procedures, shortens the processing time, reduces the production costs, and plays a role of improving the Ohmic contact and enhancing the performance of the element.

III. The PV layers are prepared.

As shown in FIG. 5, SiOx film is formed by PECVD, to obtain PV layers 10.

In this step, before preparing the PV layers, a surface oxygen protection layer can be formed on the IGZO. As for the reason to prepare the protection layer, some non-vacuum procedures, such as coating, exposing, and developing a photoresist, are included during the preparation of the IGZO layer, and a certain amount of H atoms exist in these procedures and in a subsequent plating procedure of SiOx by PECVD. These H atoms will most likely effect the performance of the IGZO layer. Therefore, forming the surface oxygen protection layer on the IGZO layer can effectively stop the effect of H atoms on the IGZO layer, and avoid the conversion of the IGZO layer from semiconductor to conductor.

The formation of the surface oxygen protection layer on the IGZO layer can be achieved by reversing a target material and meanwhile adding $O_2$ after the formation of the IGZO layer, wherein, the flow of $O_2$ is 10-20 sccm, and the adding time is 1-10 seconds. It is also possible to form the surface oxygen protection layer by adding mixed gases of $O_2$ and Ar with a flow ratio in the range from 1:10 to 1:100 after the formation of the IGZO layer, wherein the adding time of the mixed gases of $O_2$ and Ar is 1-10 seconds.

IV. The metal diffusion layer is prepared.

As shown in FIG. 6, a high temperature annealing treatment is performed on the PV layer 10 prepared in the above step, and part of indium in the source and the drain will be diffused into the interfaces both between the IGZO layer 4 and the source and between the IGZO layer 4 and the drain, to form Ohmic contact and obtain the structure shown in FIG. 6.

Although the present disclosure has been described herein with the reference of specific embodiments, it is understood that these embodiments are only examples of the principles and application of the present disclosure. Various changes may be made to the exemplary embodiments, and the various changes, without departing from the spirit and scope of the present disclosure as defined in the claims of the present disclosure, all fall in the scope of the present disclosure.

The invention claimed is:

1. A method for manufacturing a thin film transistor, wherein the thin film transistor is provided with a gate layer, a gate insulation layer, an IGZO (indium gallium zinc oxide) layer, a source, and a drain in sequence from inside to outside, and each of the source and the drain is provided with a first metal layer, a second metal layer, and a third metal layer in sequence from inside to outside, the first metal layer being in contact with the IGZO layer, and wherein the method comprises the following steps:
Step I. sequentially preparing the gate layer, the gate insulation layer, and the IGZO layer on a substrate;
Step II. preparing the source and the drain, and sequentially preparing the first metal layer, the second metal layer, and the third metal layer on each of the gate insulation layer and the IGZO layer;
Step III. preparing passivation layers; and
Step IV. performing high temperature annealing treatment on the passivation layers, indium within the first metal layer diffusing into the IGZO layer to form metal diffusion layers, thereby forming Ohmic contact at interfaces both between the IGZO layer and the source and between the IGZO layer and the drain.

2. The method for manufacturing a thin film transistor according to claim 1, wherein, each of the source and the drain is provided with a first metal layer, a second metal layer, and a third metal layer, with the first metal layer being indium, the second metal layer being molybdenum or titanium, and the third metal layer being copper or aluminum.

3. The method for manufacturing a thin film transistor according to claim 1, wherein, the first metal layer, the second metal layer, and the third metal layer are sequentially obtained by physical vapor deposition.

4. The method for manufacturing a thin film transistor according to claim 3, wherein, after the first metal layer, the second metal layer, and the third metal layer are obtained through deposition, photolithographic and etching procedures are performed to obtain a thin film transistor structure.

5. The method for manufacturing a thin film transistor according to claim 1, wherein, the passivation layers are obtained by depositing silicon oxide thin film through chemical vapor deposition.

* * * * *